(12) United States Patent
Pidwerbecki et al.

(10) Patent No.: US 10,305,529 B2
(45) Date of Patent: May 28, 2019

(54) USING MATERIALS TO INCREASE STRUCTURAL RIGIDITY, DECREASE SIZE, IMPROVE SAFETY, ENHANCE THERMAL PERFORMANCE AND SPEED CHARGING IN SMALL FORM FACTOR DEVICES

(71) Applicants: David Pidwerbecki, Hillsboro, OR (US); Mark Gallina, Hillsboro, OR (US); Mark Hemmeyer, Hillsboro, OR (US); Steven Lofland, Portland, OR (US); Ponniah Ilavarasan, Portland, OR (US); Michael Stewart, Hillsboro, OR (US); Kevin Byrd, Lake Oswego, OR (US)

(72) Inventors: David Pidwerbecki, Hillsboro, OR (US); Mark Gallina, Hillsboro, OR (US); Mark Hemmeyer, Hillsboro, OR (US); Steven Lofland, Portland, OR (US); Ponniah Ilavarasan, Portland, OR (US); Michael Stewart, Hillsboro, OR (US); Kevin Byrd, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/021,511

(22) PCT Filed: Dec. 26, 2013

(86) PCT No.: PCT/US2013/077774
§ 371 (c)(1),
(2) Date: Mar. 11, 2016

(87) PCT Pub. No.: WO2015/053801
PCT Pub. Date: Apr. 16, 2015

(65) Prior Publication Data
US 2016/0269067 A1    Sep. 15, 2016

Related U.S. Application Data

(60) Provisional application No. 61/889,140, filed on Oct. 10, 2013.

(51) Int. Cl.
*H04B 1/3888* (2015.01)
*H05K 3/28* (2006.01)
(Continued)

(52) U.S. Cl.
CPC ......... *H04B 1/3888* (2013.01); *G06F 1/1626* (2013.01); *G06F 1/1658* (2013.01);
(Continued)

(58) Field of Classification Search
CPC .. H04B 1/3888; H05K 1/0256; H05K 1/0373; H05K 3/284; H05K 2203/1327;
(Continued)

(56) References Cited

U.S. PATENT DOCUMENTS

RE41,576 E    8/2010   Bunyan et al.
7,838,335 B2 *  11/2010  Hayashi ............... H01L 21/563
                                                      438/108
(Continued)

FOREIGN PATENT DOCUMENTS

CN    101765964 A    6/2010
JP    2000-509209 A  7/2000
(Continued)

OTHER PUBLICATIONS

International Search Report and Written Opinion for International Patent Application No. PCT/US2013/077774, dated Jul. 8, 2014, 15 pages.

(Continued)

*Primary Examiner* — Rockshana D Chowdhury
(74) *Attorney, Agent, or Firm* — Jordan IP Law, LLC

(57) ABSTRACT

Systems and methods may provide for a device including a housing, one or more electronic components positioned within the housing, and a first cured resin composition positioned within the housing, the first cured resin composition including a thermal energy storage material and a first (Continued)

filler material. The device may also include a second cured resin composition positioned within the housing, the second cured resin composition including the thermal energy storage material and a second filler material. The first filler material and the second filler material may be different, wherein the first cured resin composition and the second cured resin composition may encompass at least one of the one or more electronic components. In other examples, the electronic components include a power supply and the device complies with an ATEX equipment directive for explosive atmospheres. Moreover, component underfill and/or assembly overmold processes may be used to fabricate the device.

16 Claims, 8 Drawing Sheets

(51) Int. Cl.
| | |
|---|---|
| H05K 1/02 | (2006.01) |
| H05K 1/03 | (2006.01) |
| G06F 1/16 | (2006.01) |
| G06F 1/18 | (2006.01) |
| G06F 1/20 | (2006.01) |
| H04M 1/02 | (2006.01) |
| H04M 1/18 | (2006.01) |

(52) U.S. Cl.
CPC .............. *G06F 1/18* (2013.01); *G06F 1/182* (2013.01); *G06F 1/203* (2013.01); *H04M 1/0202* (2013.01); *H04M 1/185* (2013.01); *H05K 1/0256* (2013.01); *H05K 1/0373* (2013.01); *H05K 3/284* (2013.01); *H04M 1/026* (2013.01); *H04M 1/0262* (2013.01); *H04M 1/0277* (2013.01); *H05K 2203/1327* (2013.01)

(58) Field of Classification Search
CPC ........ G06F 1/182; G06F 1/1658; G06F 1/203; G06F 1/1626; G06F 1/18; H04M 1/185; H04M 1/0202; H04M 1/026; H04M 1/0277
USPC .............. 361/753, 705, 679.04, 707, 670.53, 361/679.54, 708; 257/687, 789, 714, 778, 257/712, 787
See application file for complete search history.

(56) References Cited

U.S. PATENT DOCUMENTS

| | | | | |
|---|---|---|---|---|
| 8,130,496 | B2* | 3/2012 | Dong | B29C 45/0005 165/104.33 |
| 8,324,718 | B2* | 12/2012 | Honda | H01L 21/563 257/687 |
| 8,392,035 | B2* | 3/2013 | Patel | G06F 1/20 361/688 |
| 2004/0150118 | A1 | 8/2004 | Honda | |
| 2009/0322149 | A1* | 12/2009 | Kishibata | H05K 1/148 307/10.1 |
| 2010/0108291 | A1* | 5/2010 | Onnerud | G06F 1/203 165/80.2 |
| 2010/0201325 | A1 | 8/2010 | Oda et al. | |
| 2010/0254092 | A1 | 10/2010 | Dong et al. | |
| 2010/0264552 | A1* | 10/2010 | Nakasato | H01L 21/6835 257/778 |
| 2011/0049531 | A1* | 3/2011 | Oka | H01L 21/565 257/77 |
| 2011/0049701 | A1* | 3/2011 | Miyagawa | H01L 23/295 257/712 |
| 2011/0199204 | A1* | 8/2011 | Dionis | E05B 45/005 340/506 |
| 2011/0199348 | A1* | 8/2011 | Takatani | G02F 1/13452 345/204 |
| 2012/0187332 | A1 | 7/2012 | Iruvanti et al. | |
| 2012/0313296 | A1* | 12/2012 | Drysdale | B29C 45/14836 264/447 |
| 2012/0313656 | A1* | 12/2012 | An | H05K 1/0268 324/750.3 |
| 2013/0012618 | A1 | 1/2013 | Hiro et al. | |
| 2013/0084487 | A1* | 4/2013 | Kwak | H01M 2/0245 429/163 |
| 2013/0143030 | A1* | 6/2013 | Kim | C09D 163/00 428/320.2 |
| 2013/0229829 | A1* | 9/2013 | Zhang | H02M 3/33546 363/16 |
| 2014/0285967 | A1 | 9/2014 | Wikander et al. | |

FOREIGN PATENT DOCUMENTS

| | | |
|---|---|---|
| JP | 2000509209 A | 7/2000 |
| JP | 2001277292 A | 10/2001 |
| JP | 2013-206902 A | 10/2013 |
| KR | 10-2013-0102447 A | 9/2013 |
| TW | 200423338 A | 11/2004 |
| TW | 201106851 A | 2/2011 |
| TW | 201337517 A | 9/2013 |
| WO | 2013075012 A2 | 5/2013 |
| WO | 2013/090286 A1 | 6/2013 |
| WO | 2013090286 A1 | 6/2013 |

OTHER PUBLICATIONS

"On the Approximation of the Laws of the Member States Concerning Equipment and Protective Systems Intended for Use in Potentially Explosive Atmospheres", Official Journal of the European Communities, Mar. 23, 1994, 29 pages.
Office Action for Korean Patent Application No. 2016-7006250, dated May 8, 2017, 13 pages including 6 pages of English translation.
Office Action for Japanese Patent Application No. 2016-546736, dated Feb. 16, 2017, 9 pages including 5 pages of English translation.
Selected Gazette, JP3122989U, retrieved from j-platpat.inpit.gajp/cgi-bin/tran_web_cgi_ejje?u=http://www4j-platpat . . . 38 , retrieved on Feb. 21, 2017, 8 pages.
Office Action for Korean Patent Application No. 2016-7006250, dated Nov. 29, 2017, 6 pages including 3 pages of English translation.
Office Action for Japnese Patent Application No. 2016-546736, dated Oct. 11, 2017, 4 pages including 2 pages of English translation.

* cited by examiner

USING MATERIALS TO INCREASE STRUCTURAL RIGIDITY, DECREASE SIZE, IMPROVE SAFETY, ENHANCE THERMAL PERFORMANCE AND SPEED CHARGING IN SMALL FORM FACTOR DEVICES

CROSS-REFERENCE TO RELATED APPLICATIONS

The present application is a U.S. National Phase Patent Application which claims benefit to International Patent Application No. PCT/US2013/077774 filed Dec. 26, 2013, which claims the benefit of priority to U.S. Provisional Patent Application No. 61/889,140 filed Oct. 10, 2013.

TECHNICAL FIELD

Embodiments generally relate to electronic devices. More particularly, embodiments relate to the use of materials to increase structural rigidity, decrease size, improve safety, enhance thermal performance and speed charging in small form factor devices.

BACKGROUND

Certain approaches to reducing the size of small form factor devices such as, for example, smart phones, tablet computers and power supplies, may involve eliminating space occupying components such as fans. The elimination of those components, however, may have a negative impact on thermal performance. For example, with regard to power supplies, fanless designs may result in less charging capacity and/or slower charging rates in order to prevent internal junction and external skin temperature limits from being exceeded during operation. Moreover, thinner devices may be more structurally flexible, fragile and easily damaged upon impact. In addition, as devices become smaller and thinner, they may become more portable, wherein this portability may lead to exposure of the devices to more dust and water. Indeed, the use of electronic devices in potentially explosive environments (e.g., petro-chemical, utility, marine transfer, granary, pharmaceutical, consumer packaging, alcohol processing and/or paint manufacturing environments) may cause safety concerns if components of the devices create small sparks, generate heat and potentially become an ignition source. Small form factor devices, in particular, may be difficult to render intrinsically safe.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
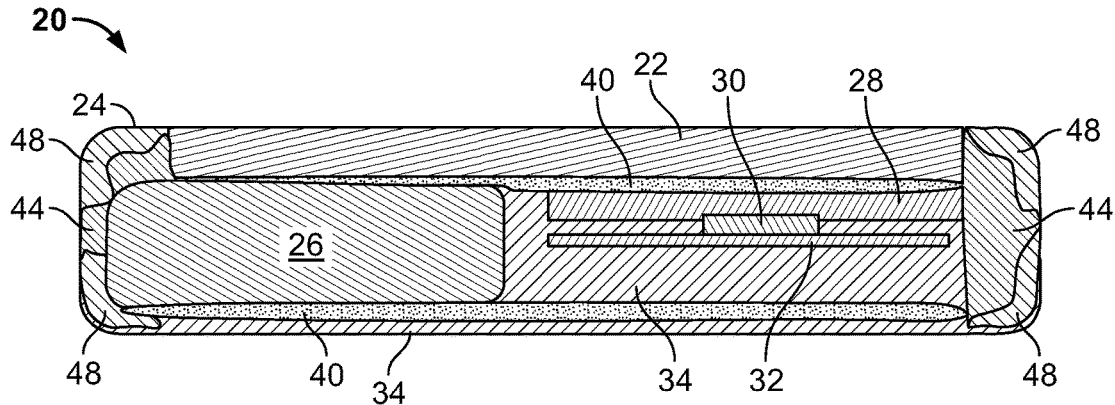
FIG. 1 is a sectional view of an example of a device having multiple different resin compositions according to an embodiment.

Turning now to FIG. 1, an electronic device 20 is shown, wherein the device 20 includes a user interface (UI, e.g., keyboard, display panel) component 22 and a small form factor housing 24 that contains one or more additional electronic components such as, for example, a battery 26, a circuit board 28 (e.g., motherboard) having a processor 30 mounted thereon, and so forth. The electronic device 20 may function as, for example, a smart phone, tablet computer, personal digital assistant (PDA), mobile Internet device (MID), media player, wearable computer, power supply, etc., or any combination thereof In general, components such as the battery 26 and the processor 30 may generate heat during operation. In the illustrated example, the processor 30 is thermally coupled to a heat spreader 32 that conducts heat away from the processor 30 and distributes it throughout the interior of the device 20.

As will be discussed in greater detail, the housing 24 may also contain one or more resin compositions that encompass the electronic components of the device 20. The resin compositions may generally include an epoxy, silicone, urethane or other adhesive compound having a relatively low viscosity and high surface tension that enables the resin to wick under and around solder joints and components such as, for example, the battery 26, the processor 30 and the circuit board 28 in order to form a tight bond between those joints/components and the interior surface of the housing 24 upon curing of the resin. As a result, the electronic device 20 may be an interlocked, waterproof and rigid structure. Additionally, different resin compositions may be used in different locations within the device 20 to provide specific functions of interest.

Multiple Filler Resin Compositions

Figure 2:
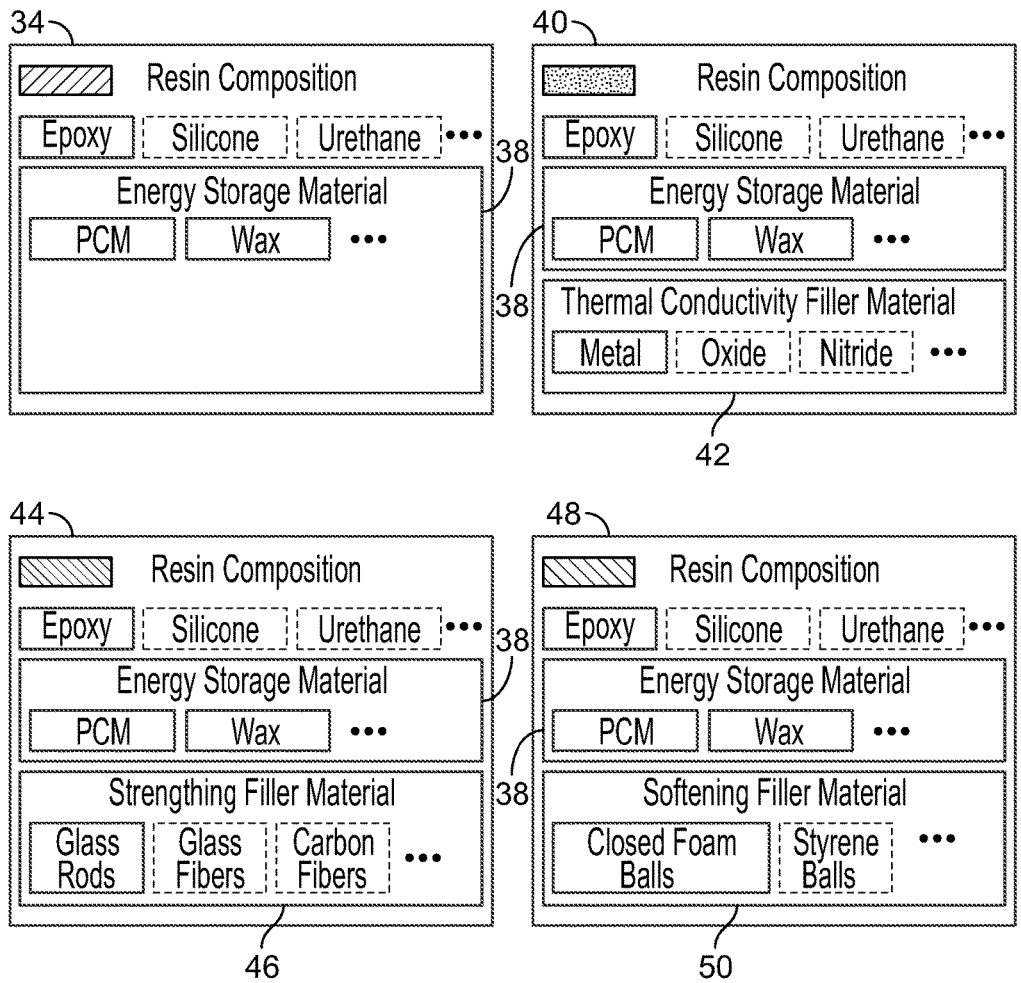
FIG. 2 is a block diagram of an example of multiple different resin compositions according to an embodiment.

With continued reference to FIGS. 1 and 2, a first resin composition 34 might contain a thermal energy storage material 38 (e.g., phase change material/PCM) in addition to a low viscosity adhesive compound (e.g., epoxy, silocone, urethane). In one example, Eicosane (38° C. melt) wax or Docosane (42° C. melt) wax is used as the PCM, wherein the PCM may provide an additional form of energy storage in the form of latent heat (e.g., during a latent heat phase). For example, during the latent heat phase, thermal energy may flow into the PCM and change it from one phase to another, such as from a solid to a liquid, while the temperature (e.g., $T_{melt}$) remains relatively constant during the transition. The effective mass of the material as a result of the phase change may therefore be relatively high. The thermal energy storage material may also function as a thermal capacitance filler material that stores thermal energy and enables electronic components such as the processor 30 to operate at relatively high frequencies.

A second resin composition 40, on the other hand, might include a thermal conductivity filler material 42 (e.g., metal, oxide, nitride, metal, salt) in addition to the thermal energy storage material 38 and the low viscosity adhesive compound. The thermal conductivity filler material 42 may therefore enable significant heat spreading and enhanced performance. For example, the illustrated second resin composition 40 is formed into the shape of multiple heat spreaders that thermally interface with heat generating components such as, for example, the battery 26. The heat generated by the battery 26 may therefore be absorbed by the energy storage material 38 of the second resin composition 40, as well as distributed to the other resin compositions within the interior of the housing 24. Other high surface area designs such as, for example, multi-fin configurations, etc., may be created with the second resin composition 40.

Additionally, a third resin composition 44 may include a strengthening filler material 46 (e.g., glass rods, glass fibers, carbon fibers) that increases the effective area of the moment of inertia and the composite modulus of elasticity of the device 20. As a result, the third resin composition 44 may increase the stiffness of the device 20. By making the device 20 more mechanically resistant to twisting, bending, etc., the third resin composition 44 may increase the ruggedness of the device 20. Such an approach may be particularly useful in very thin form factor devices such as, for example, tablet computers.

Moreover, a fourth resin composition 48 may include a softening filler material 50 (e.g., closed foam balls, styrene balls) that increases the absorption and spreading of mechanical energy when impact occurs (e.g., impact strength). Therefore, the fourth resin composition 48 may further increase the ruggedness of the device 20, which may be useful in small form factor devices that are prone to being dropped, etc. The positioning of the resin compositions 34, 40, 44, 48 may vary depending upon the circumstances. As will be discussed in greater detail, the illustrated approach enables several different functional concerns to be addressed (e.g., thermal capacitance, thermal conductivity, strengthening, softening) without requiring different manufacturing process conditions. Other optimizations such as, for example, coefficient of thermal expansion (CTE) matching between the resin compositions 34, 40, 44, 48 and the solder joints and components of the device 20 may be conducted in order to minimize mechanical stress within the device 20.

Figure 3:
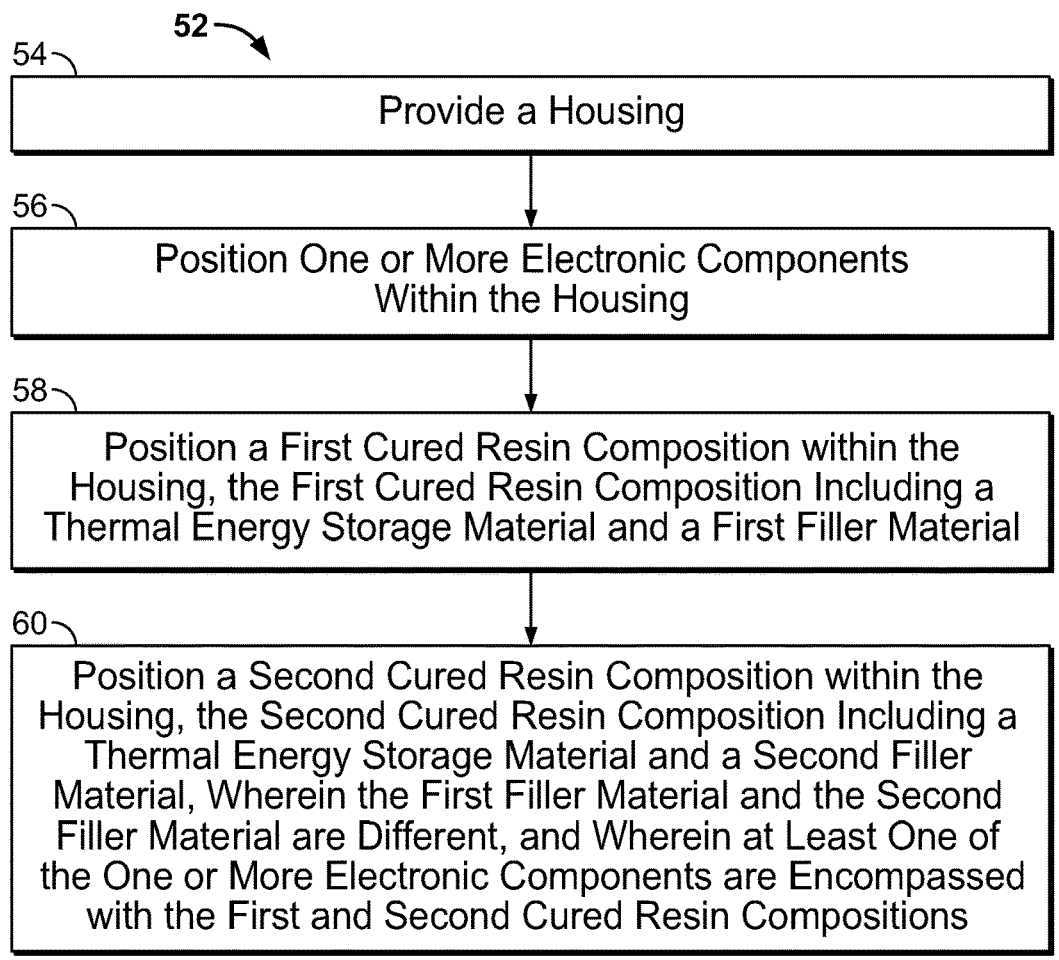
FIG. 3 is a flowchart of an example of a method of fabricating a device having multiple different resin compositions according to an embodiment.

Turning now to FIG. 3, a method 52 of fabricating a device is shown. The method 52 may be implemented using well documented manufacturing technologies such as, for example, casting, low pressure injection molding, surface mount technology (SMT), semiconductor fabrication, etc. The method 52 may also be implemented as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

Illustrated processing block 54 provides a housing such as, for example, the enclosure, skin and/or shell of an electronics device. The housing may include, but is not limited to, plastic, metal, etc., or any combination thereof. One or more electronic components may be positioned within the housing at block 56, wherein illustrated block 58 positions a first cured resin composition within the housing. As will be discussed in greater detail, positioning cured resin compositions within housings may involve injecting or casting a resin composition into the housing and either actively or passively curing the injected/casted resin composition. The first cured resin composition may include a thermal energy storage material and a first filler material. As already noted, the thermal energy storage material might include a phase change material that enhances the thermal performance of the device, and the first filler material may include, for example, a thermal capacitance material, a thermal conductivity material, a strengthening material, a softening material, and so forth.

Similarly, block 60 may position a second cured resin composition within the housing, wherein the second cured resin composition includes a thermal energy storage material and a second material (e.g., thermal capacitance, thermal conductance, strengthening, softening). In the illustrated example, the first filler material and the second filler material are different and at least one of the one or more electronic components are encompassed with the first and second cured resin compositions.

Power Supplies

Figure 4:
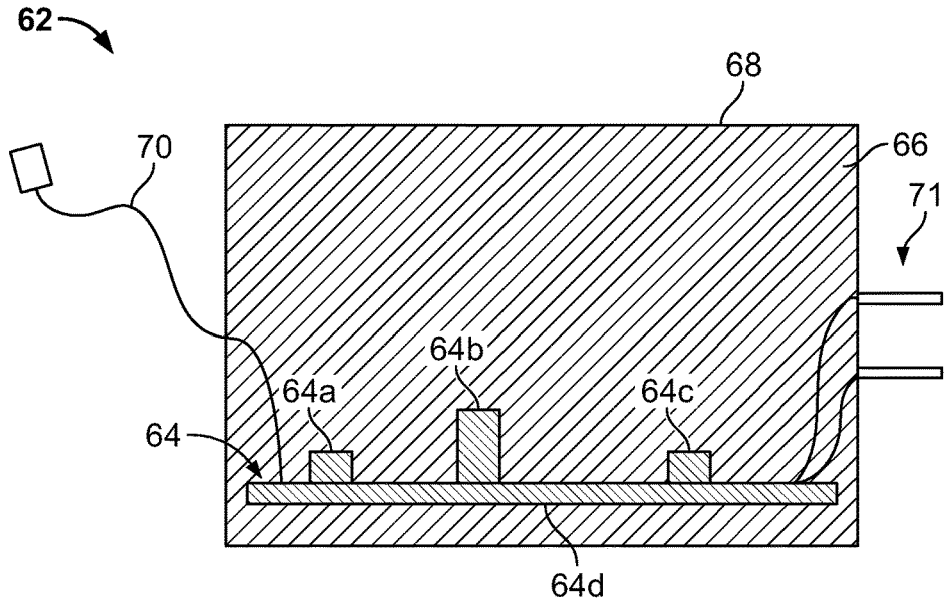
FIG. 4 is sectional view of an example of a device including a power supply according to an embodiment.

FIG. 4 shows an electronic device 62 that includes one or more power supply components 64 (64a-64d) coupled to an input 71 and an output 70, and positioned within a housing 68. The electronic device 62 may function as a wall charger, car charger, solar inverter, electric car voltage converter, etc., in which a significant amount of heat may result from the generation and delivery of power via the output 70. In the illustrated example, the power supply components 64 are encompassed by one or more cured resin compositions 66 that include a low viscosity adhesive compound and a thermal energy storage material such as, for example, a phase change material, wherein the one or more cured resin compositions 66 encompass the power supply components 64. The one or more cured resin compositions 66 may also include various filler materials, as already discussed.

In one example, the power supply components 64 include a controller 64a that is configured to operate the power supply components 64 in a burst charge mode, wherein the thermal energy storage functionality of the one or more cured resin compositions may enable use of the burst charge mode without exceeding skin temperature limits associated with the housing 68 or junction temperature limits of the power supply components 64. The burst charge mode may include outputting, for example, a charge current that is greater than the charge current associated with similarly sized conventional power supplies. Accordingly, the burst charge mode enabled by the one or more cured resin compositions 66 may lead to faster charging of battery operated devices such as, for example, the device 20 (FIG. 1), in certain circumstances (e.g., a conventional 20V, 3.25 A charger might be rated at 20V, 5 A using the techniques described herein). The one or more cured resin compositions may also enable a reduction in the size of the electronic device 62 due to the thermal energy storage and enhanced thermal performance obviating concerns over component spacing and skin temperatures.

Figure 5:
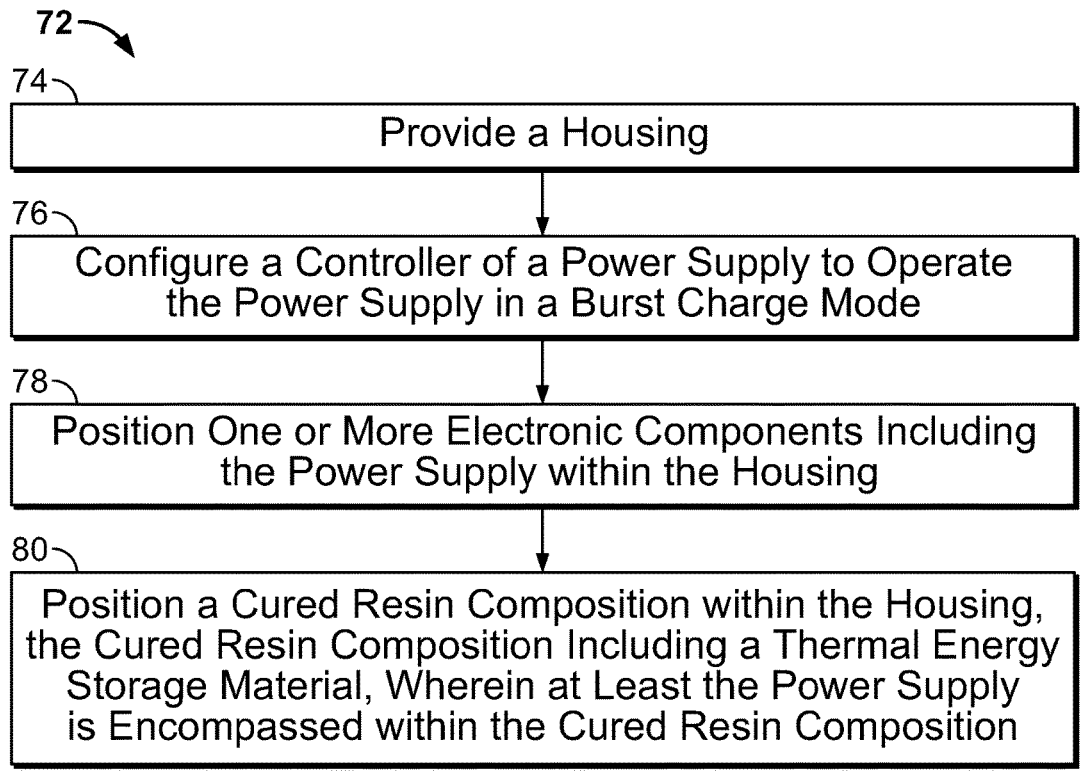
FIG. 5 is a flowchart of an example of a method of fabricating a power supply according to an embodiment.

Turning now to FIG. 5, a method 72 of fabricating a power supply is shown. The method 72 may be implemented using well documented manufacturing technologies such as, for example, casting, low pressure injection molding, SMT, semiconductor fabrication, etc. The method 72 may also be implemented as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 74 provides a housing such as, for example, the enclosure, skin and/or shell of an electronics device. The housing may include, but is not limited to, plastic, metal, etc., or any combination thereof. A controller of the power supply may be configured at block 76 to operate the power supply in a burst charge mode. As already noted, the burst charge mode might include outputting, for example, a relatively high charge current that enables fast charging of battery operated devices such as, for example, the device 20 (FIG. 1). Configuring the controller to operate the power supply in the burst charge mode may involve fabricating fixed-functionality hardware of the controller, programming configurable logic of the controller, storing instructions to memory of the controller, etc., to activate the burst charge mode.

One or more electronic components including the power supply may be positioned within the housing at block 78, wherein illustrated block 80 positions a cured resin composition within the housing. The cured resin composition may include a low viscosity adhesive compound and a thermal energy storage material, wherein the power supply is encompassed within the cured resin composition.

Intrinsic Safety

Figure 6:
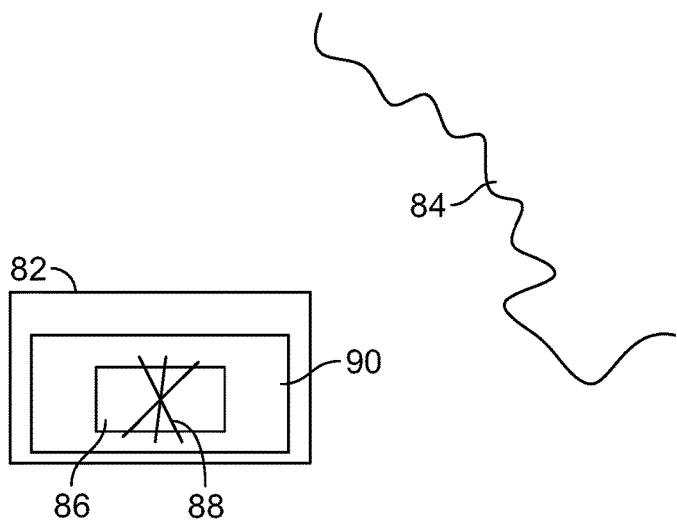
FIG. 6 is an illustration of an example of a device in an explosive environment according to an embodiment.

FIG. 6 shows a device 82 in a hazardous and/or explosive environment such as, for example, a petro-chemical, utility, marine transfer, granary, pharmaceutical, consumer packaging, alcohol processing and/or paint manufacturing environment. Accordingly, the environment may contain a flammable substance 84 such as, for example, hydrogen, ammonia, hydrocarbon compound or other explosive gas, vapor, mist, dust, etc. The device 82 may function as, for example, a smart phone, tablet computer, PDA, MID, media player, wearable computer, power supply, etc., or any combination thereof. Accordingly, the device 82 may include one or more electronic components 86 (e.g., processors, controllers, chips, circuits) that produce an ignition source 88 such as sparks and/or heat before, during or after operation. In the illustrated example, the electronic components 86 are encompassed by a cured resin composition 90 that prevents the ignition source 88 from escaping the device 82 and igniting the flammable substance 84. The cured resin composition 90 may include a low viscosity adhesive compound and a thermal energy storage material. The illustrated cured resin composition 90 may therefore enable the device 82 to be considered "intrinsically safe".

In one example, the cured resin composition 90 enables the device 82 to comply with an ATEX equipment directive for explosive atmospheres (e.g., ATEX 95 equipment directive 94/9/EC, Equipment and protective systems intended for use in potentially explosive atmospheres). Thus, the cured resin composition 90 may protect against hazards arising from, for example, different ignition sources, static electricity, stray electric and leakage currents, overheating, pressure compensation operations and external effects. The device 82 may also include an additional cover/case (e.g., leather) to facilitate dissipation of static electric charges. Of particular note is that the illustrated approach may obviate any need for the use of gaskets, etc., pressurization, oil/fluid baths, quartz sand/powder, and so forth, to seal the device 82.

Component Underfill

Figure 7A:
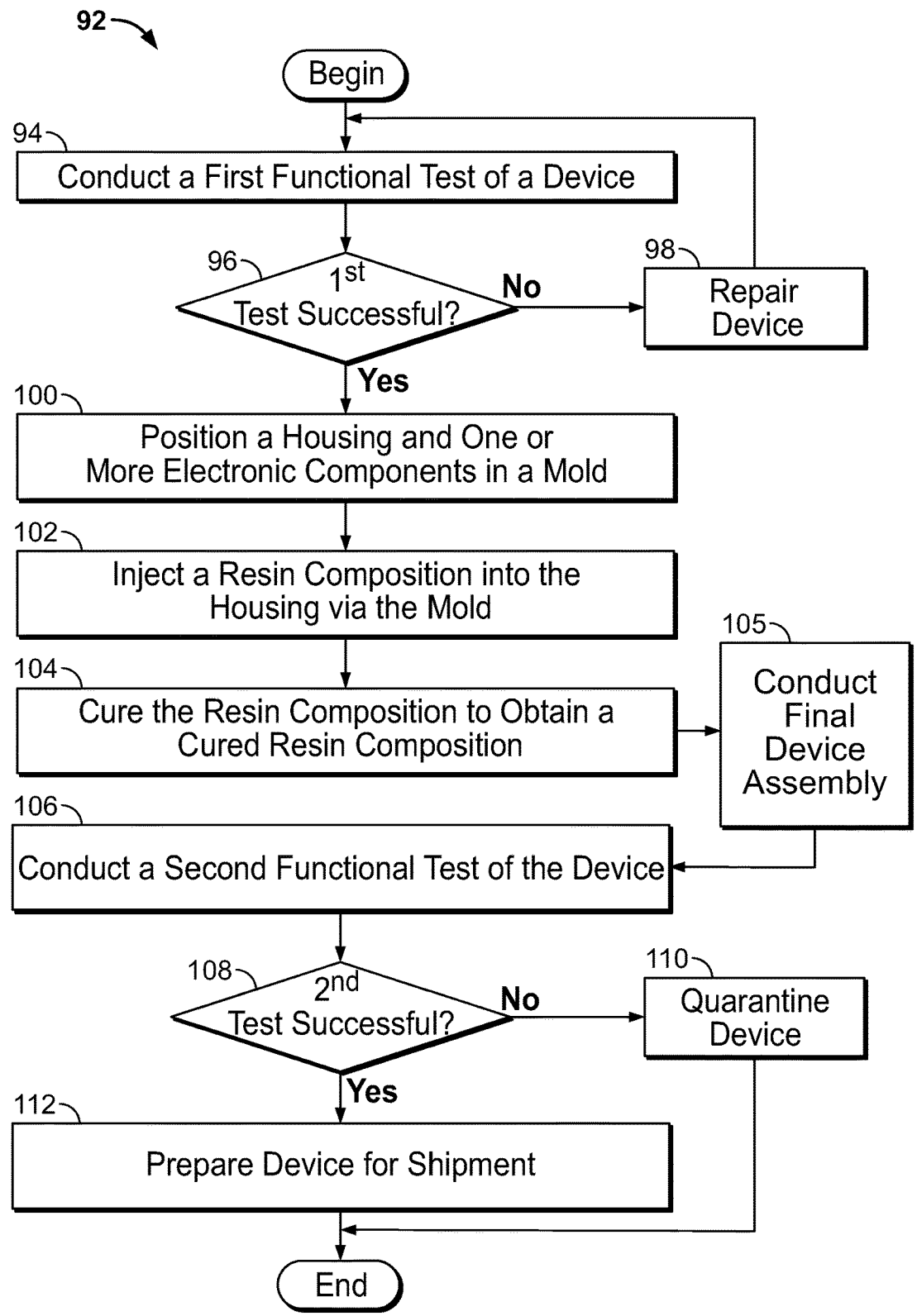
FIGS. 7A and 7B are flowcharts of examples of component underfill manufacturing processes according to embodiments.

Turning now to FIG. 7A, a component underfill manufacturing process 92 is shown for a device having a single resin composition. The illustrated approach may generally replace a different manufacturing step and material where the component underfill is performed after component solder reflow. Such an approach may therefore shift the component underfill process to the resin injection stage, eliminating any need to perform a separate underfill process during the circuit board assembly process. More particularly, illustrated processing block 94 conducts a first functional test of the device. The first functional test may ensure, for example, that one or more high level or lower level (e.g., subcomponent) aspects of the device are operating correctly. If it is determined at block 96 that the test was unsuccessful, block 98 may provide for repairing the device and repeating the first functional test. If the first functional test is successful, illustrated block 100 positions a housing and one or more electronic components of the device in a mold, wherein a resin composition may be injected into the housing via the mold at block 102.

Figure 8:
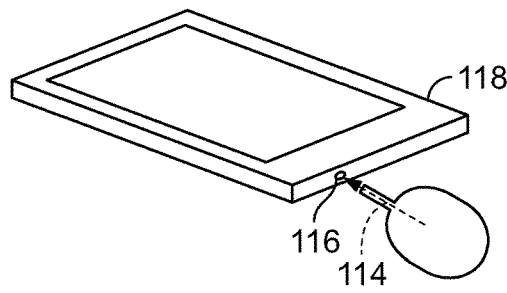
FIG. 8 is a perspective view of an example of a component underfill manufacturing environment that uses an audio port according to an embodiment.

The injection of the resin composition, which may be conducted at relatively low pressure (e.g., approximately 1.5 bar or less), may cause the resin composition to wick between at least one of the one or more electronic components and an adjacent circuit board of the device. FIG. 8 demonstrates that the resin composition 114 may be injected through an audio port 116 of a device 118. In this regard, the audio port 116 may originally have a passageway to the interior of the device 118 that is closed off by the resin composition upon injection and curing. Such an approach may provide cosmetic advantages by visually hiding any usage of the resin composition from the user of the device 118.

Returning to FIG. 7A, block 104 may cure/harden the resin composition to obtain a cured resin composition. The cure temperature may be slightly elevated or close to room temperature (e.g., 50° C.) and the cure time may be sufficiently slow to ensure low internal post cure stresses and improve device robustness. Illustrated block 105 conducts a final device assembly, which may involve installing user removable components such as, for example, subscriber identity module/SIM card trays, battery covers, secure digital/SD card slot covers, back covers, etc. A second functional test of the device may be conducted at block 106 in order to confirm that the injection, curing and final device assembly processes did not negatively impact device performance. If it is determined at block 108 that the second functional test was unsuccessful, block 110 may provide for quarantining the device for further analysis, disassembly and/or scrapping. If, on the other hand, it is determined at block 108 that the second functional test was successful, block 112 may involve preparing (e.g., packaging) the device for shipment. The illustrated process 92 therefore enables the low cost fabrication of thin, rugged devices.

Figure 7B:
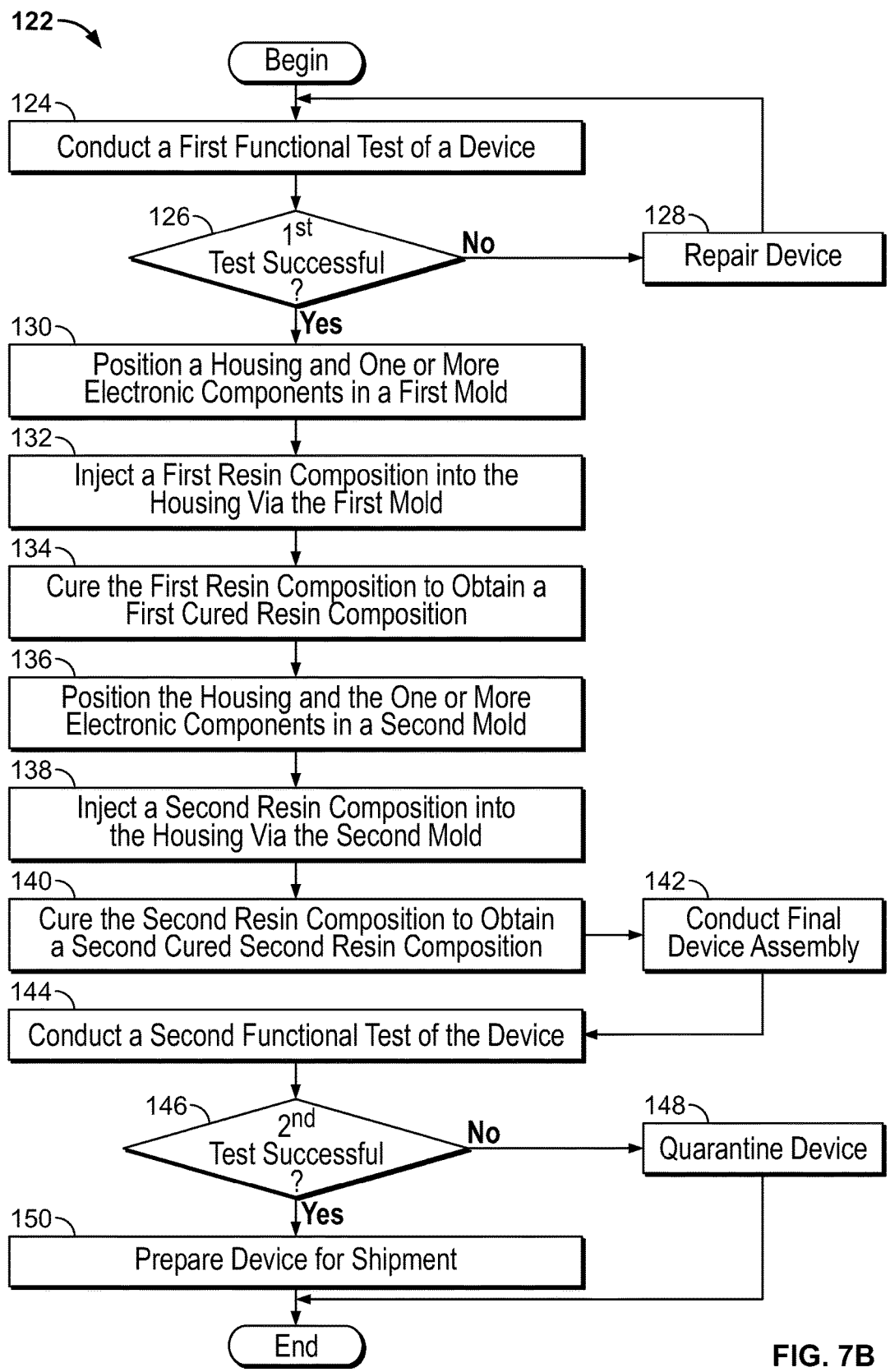

FIG. 7B shows a component underfill manufacturing process 122 for a device having multiple resin compositions (e.g., with different filler materials). Illustrated processing block 124 conducts a first functional test of the device. The first functional test may ensure, for example, that one or more high level or lower level (e.g., subcomponent) aspects of the device are operating correctly. If it is determined at block 126 that the test was unsuccessful, block 128 may provide for repairing the device and repeating the first functional test. If the first functional test is successful, illustrated block 130 positions a housing and one or more electronic components of the device in a first mold, wherein a resin composition may be injected into the housing via the first mold at block 132. The first mold might be configured to ensure that the first resin composition flows only to certain areas of the interior of the device, such as in the case of the first resin composition 34 (FIG. 1), already discussed. Block 134 may cure/harden the first resin composition to obtain a first cured resin composition.

In addition, the housing and the one or more electronic components may be positioned in a second mold at block 136, wherein illustrated block 138 injects a second resin composition into the housing via the second mold. The second mold may also be configured to ensure that the second resin composition flows only to certain areas of the interior of the device, such as in the case of the second resin composition 40 (FIG. 1), already discussed. As already noted, the injection of the resin compositions may be conducted and relatively low pressure and may cause the resin compositions to wick between at least one of the one or more electronic components and an adjacent circuit board such as, for example, the circuit board 28 (FIG. 1) of the device. Moreover, the resin compositions may be injected through an audio port of the device, depending upon the circumstances (e.g., mold arrangement, audio port positioning). The second resin composition may be cured at block 140, wherein block 142 may conduct a final device assembly to install, for example, user removable components. The illustrated molding sequence may be repeated for additional resin compositions, as appropriate.

Illustrated block 144 conducts a second functional test of the device. If it is determined at block 146 that the second functional test was unsuccessful, block 148 may provide for quarantining the device for further analysis, disassembly and/or scrapping. If, on the other hand, it is determined at block 146 that the second functional test was successful, block 150 may involve preparing (e.g., packaging) the device for shipment. The illustrated process 122 therefore enables the low cost fabrication of tin, rugged devices having internal zones that are tailored to provide specific functionalities (e.g., thermal capacitance, thermal conductance, strength, impact resistance, etc.).

Assembly Overmold

Figure 9A:
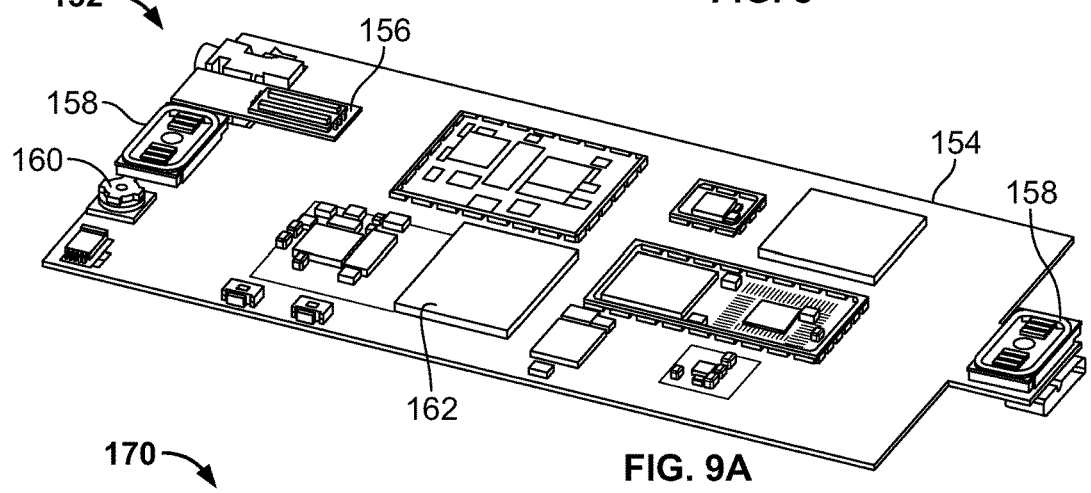
FIG. 9A is a perspective view of a circuit board assembly according to an embodiment.
Figure 9B:
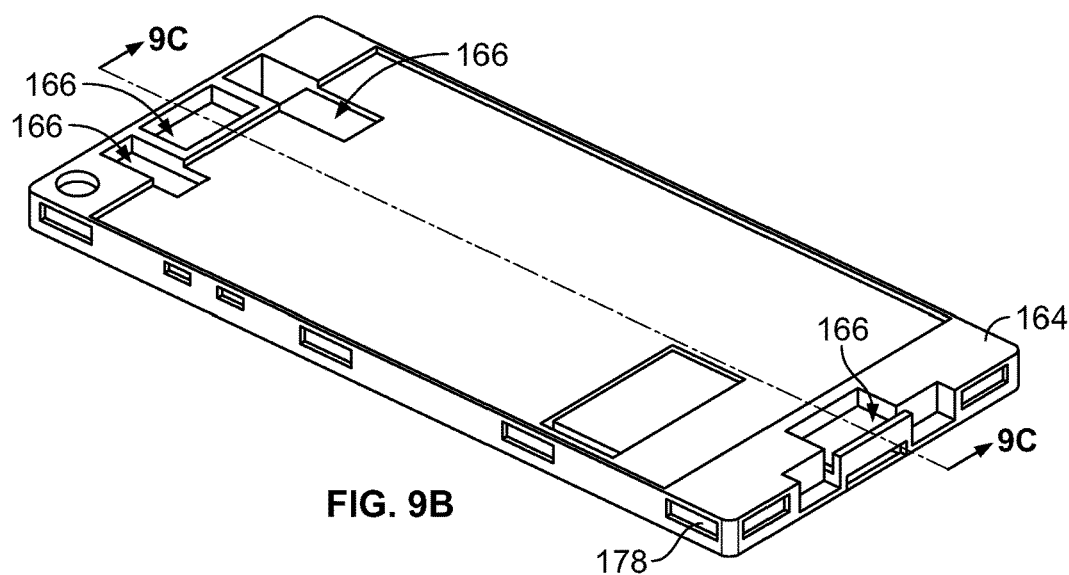
FIG. 9B is a perspective view of an overmolded circuit board assembly according to an embodiment.

Turning now to FIG. 9A, a perspective view of a circuit board assembly 152 is shown. The illustrated circuit board assembly 152 includes a main circuit board 154 having a variety of components mounted thereon. For example, certain components such as a camera 156, speakers 158 and an ambient light sensor 160 may interact with the exterior of the device during operation, whereas other components such as a processor 162 may not interact with the exterior of the device during operation. Indeed, safety concerns may dictate that the processor 162 be thermally isolated from the ambient environment and/or external enclosure, skin or housing of the device due to sparks and/or heat generated by the processor 162.

Figure 9C:
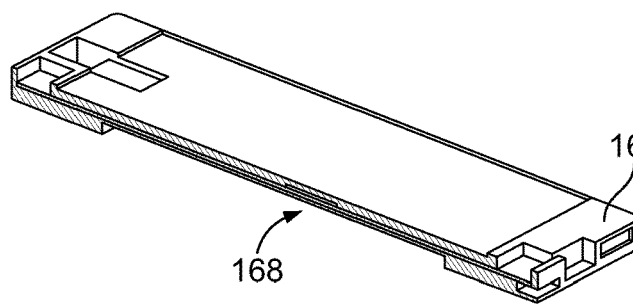
FIG. 9C is a sectional view along lines 9C-9C in FIG. 9B.

With continuing reference to FIGS. 9A-9D a portion of the circuit board assembly 152 is shown after being overmolded with a resin composition 164 as described herein to obtain an overmolded circuit board assembly 170. In the illustrated example, the components such as the processor 162 that do not interact with the exterior of the device during operation are encompassed by the resin composition 164. The resin composition 164 may therefore protect underlying components and enhance thermal performance. As will be discussed in greater detail, the overmolding process may involve positioning the main circuit board within a mold that forms one or more openings 166 for additional components such as the camera 156, speakers 158 and ambient light sensor 160 to pass through. As best shown in FIG. 9C, the mold may also form one or more rear openings 168 for other components such as a battery 174 to pass through.

Figure 9D:
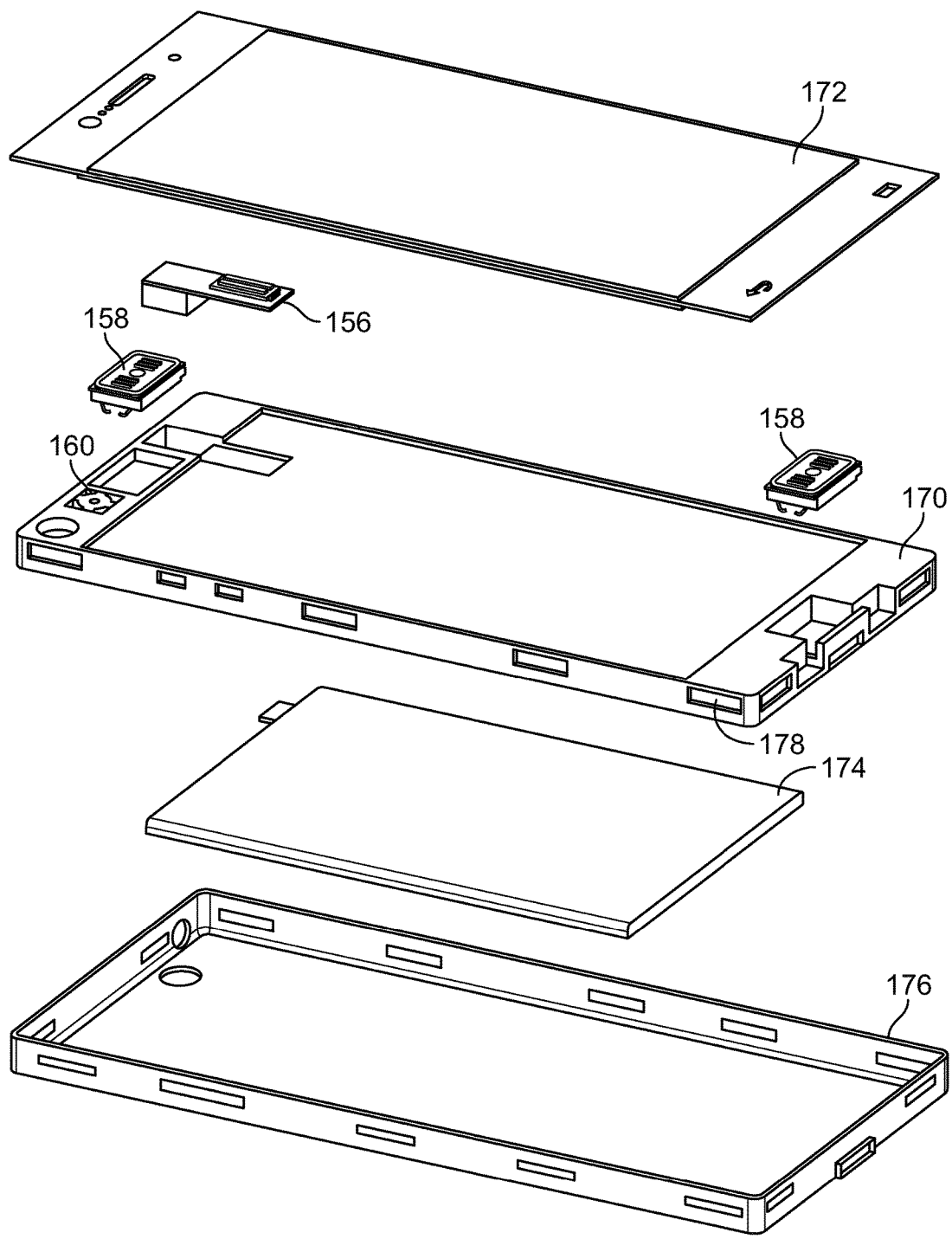
FIG. 9D is an exploded perspective view of a device having an overmolded circuit board according to an embodiment.

As best shown in FIG. 9D, the overmolded circuit board assembly 170 may be combined with a touch screen display 172, the camera 156, the speakers 158, the ambient light sensor 160, the battery 174 and a back cover 176 to form the final device. One or more attach points 178 also formed in the resin composition (e.g., rather than extra screws, etc.) may be used to couple the back cover 176 (e.g., housing) to the overmolded circuit board assembly 170. Of particular note is that the cured resin composition 164 of the overmolded circuit board assembly 170 may provide sufficient structural rigidity to eliminate separate stainless steel or magnesium structural support components that may be prevalent in conventional designs. In addition, the CTE of the resin composition 164 may be matched to that of the solder joints on the circuit board 154 to minimize mechanical stress on the joints, as already noted.

Figure 10:
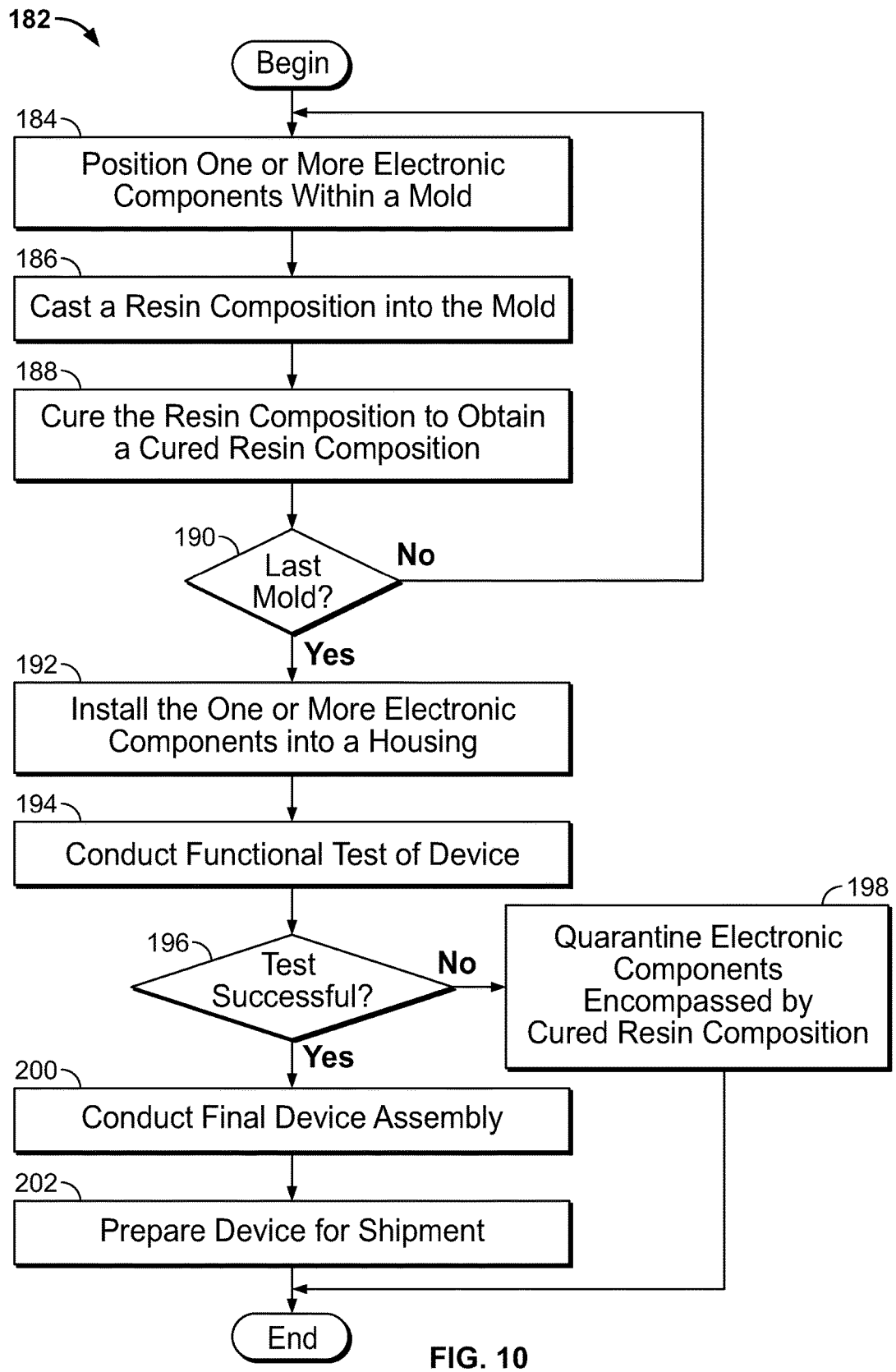
FIG. 10 is a flowchart of an example of an overmold manufacturing process according to an embodiment.

FIG. 10 shows an overmold manufacturing process 182 for an electronic device. Illustrated processing block 184 positions one or more electronic components within a mold, wherein the mold may form one or more openings in a resin composition for one or more additional components to pass through. A resin composition may be cast into the mold at block 186. As already noted, the resin composition may include a low viscosity adhesive compound, a thermal energy storage material, filler materials, and so forth. Moreover, casting the resin composition into the mold may cause the resin composition to wick between the electronic components and an adjacent circuit board of the device. The resin composition may be cured/hardened at block 188, wherein illustrated block 190 determines whether the last mold has been used. Block 190 may therefore enable the use of multiple resin compositions having, for example, different filler materials for different purposes.

If the last mold has not been used, the illustrated approach repeats the mold preparation, casting and curing stages for the next mold. Otherwise, the one or more electronic components may be installed into a housing at block 192, wherein installing the one or more electronic components into the housing may include using one or more attach points of the cured resin composition (e.g., rather than extra screws, etc.) to couple the housing to the electronic components. Additionally, block 194 may conduct a functional test of the device. The functional test may ensure, for example, that one or more high level or lower level aspects of the overmolded components are operating correctly.

If it is determined at block 196 that the functional test was not successful, the overmolded components (e.g., the electronic components encompassed by the cured resin composition) may be quarantined at block 198 for further analysis, disassembly and/or scrapping. Of particular note is that the illustrated quarantine stage at block 198 may be limited to only the overmolded components (e.g., rather than the entire device).

If it is determined at block 196 that the functional test was successful, block 200 may conduct a final device assembly, which may involve installing user removable components such as, for example, SIM card trays, battery covers, SD card slot covers, back covers, etc. Illustrated block 202 involves preparing (e.g., packaging) the device for shipment. The illustrated process 182 therefore enables the low cost fabrication of thin, rugged devices.

Additional Notes and Examples:

Example 1 may include an electronic device comprising a housing, one or more electronic components positioned within the housing, a first cured resin composition positioned within the housing, the first cured resin composition including a thermal energy storage material and a first filler material, and a second cured resin composition positioned within the housing, the second cured resin composition including the thermal energy storage material and a second filler material, wherein the first filler material and the second filler material are different, and wherein the first cured resin composition and the second cured resin composition encompass at least one of the one or more electronic components.

Example 2 may include the device of Example 1, wherein the first cured resin composition and the second cured resin composition provide adhesion between two or more components of the device.

Example 3 may include the device of Example 1, wherein the thermal energy storage material functions as a thermal capacitance material.

Example 4 may include the device of Example 3, wherein the thermal capacitance material includes a wax.

Example 5 may include the device of Example 1, wherein one of the first filler material and the second filler material includes a thermal conductivity material.

Example 6 may include the device of Example 5, wherein the thermal conductivity material includes one or more of a metal, an oxide, a salt, or a nitride.

Example 7 may include the device of Example 1, wherein one of the first filler material and the second filler material includes a strengthening material.

Example 8 may include the device of Example 7, wherein the strengthening material includes one or more of glass rods, glass fiber, or carbon fibers.

Example 9 may include the device of Example 1, wherein one of the first filler material and the second filler material includes a softening material.

Example 10 may include the device of Example 9, wherein the softening material includes one or more of closed cell foam balls or styrene balls.

Example 11 may include the device of Example 1, wherein one or more of the first cured resin composition and the second cured resin composition includes one or more of an epoxy, a silicone, or a urethane.

Example 12 may include the device of Example 1, wherein the thermal energy storage material includes a phase change material.

Example 13 may include the device of any one of Examples 1 to 12, wherein at least one of the one or more electronic components includes a power supply.

Example 14 may include the device of Example 13, wherein the power supply includes a controller to operate the power supply in a burst charge mode.

Example 15 may include the device of any one of Examples 1 to 12, wherein at least one of the one or more electronic components is a source of one or more of sparks or heat.

Example 16 may include the device of Example 1, wherein the device complies with an ATEX equipment directive for explosive atmospheres.

Example 17 may include an electronic device comprising a housing, one or more electronic components positioned within the housing, wherein at least one of the one or more electronic components includes a power supply, and a cured resin composition positioned within the housing, the cured resin composition including a thermal energy storage material, wherein the cured resin composition encompasses at least the power supply.

Example 18 may include the device of Example 17, wherein the power supply includes a controller to operate the power supply in a burst charge mode.

Example 19 may include the device of any one of Examples 17 or 18, wherein at least the power supply is a source of one or more of sparks or heat.

Example 20 may include the device of Example 19, wherein the device complies with an ATEX equipment directive for explosive atmospheres.

Example 21 may include an electronic device comprising a housing, one or more electronic components positioned within the housing, wherein at least one of the one or more electronic components is a source of one or more of sparks or heat, and a cured resin composition positioned within the housing, the cured resin composition including a thermal energy storage material, wherein the cured resin composition encompasses the at last one of the one or more electronic components that is the source of one or more of sparks or heat.

Example 22 may include the device of Example 21, wherein the device complies with an ATEX equipment directive for explosive atmospheres.

Example 23 may include a method of fabricating a device, comprising providing a housing, positioning one or more electronic components within the housing, positioning a first cured resin composition within the housing, the first cured resin composition including a thermal energy storage material and a first filler material, and positioning a second cured resin composition within the housing, the second cured resin composition including the thermal energy storage material and a second filler material, wherein the first filler material and the second filler material are different, and wherein at least one of the one or more electronic components are encompassed with the first cured resin composition and the second cured resin composition.

Example 24 may include the method of Example 23, wherein the first cured resin composition and the second cured resin composition provide adhesion between two or more components of the device.

Example 25 may include the method of Example 23, wherein the thermal energy storage material functions as a thermal capacitance material.

Example 26 may include the method of Example 25, wherein the thermal capacitance material includes a wax.

Example 27 may include the method of Example 23, wherein one of the first filler material and the second filler material includes a thermal conductivity material.

Example 28 may include the method of Example 27, wherein the thermal conductivity material includes one or more of a metal, an oxide, a salt, or a nitride.

Example 29 may include the method of Example 23, wherein one of the first filler material and the second filler material includes a strengthening material.

Example 30 may include the method of Example 29, wherein the strengthening material includes one or more of glass rods, glass fiber, or carbon fibers.

Example 31 may include the method of Example 23, wherein one of the first filler material and the second filler material includes a softening material.

Example 32 may include the method of Example 31, wherein the softening material includes one or more of closed cell foam balls or styrene balls.

Example 33 may include the method of Example 23, wherein one or more of the first cured resin composition and the second cured resin composition includes one or more of an epoxy, a silicone, or a urethane.

Example 34 may include the method of Example 23, wherein the thermal energy storage material includes a phase change material.

Example 35 may include the method of any one of Examples 23 to 34, wherein at least one of the one or more electronic components includes a power supply.

Example 36 may include the method of Example 35, further including configuring a controller of the power supply to operate the power supply in a burst charge mode.

Example 37 may include the method of any one of Examples 23 to 34, wherein at least one of the one or more electronic components is a source of one or more of sparks or heat.

Example 38 may include the method of Example 37, wherein the first cured resin composition and the second cured resin composition enable the device to comply with an ATEX equipment directive for explosive atmospheres.

Example 39 may include the method of any one of Examples 23 to 34, wherein positioning the first cured resin composition and the second cured resin composition within the housing includes positioning the housing and the one or more electronic components within a first mold, injecting a first resin composition into the housing via the first mold, curing the first resin composition to obtain the first cured resin composition, positioning the housing and at least one of the one or more electronic components within a second mold, injecting a second resin composition into the housing via the second mold, and curing the second resin composition to obtain the second cured resin composition.

Example 40 may include the method of Example 39, further including conducting a first functional test of the device, wherein the housing and the one or more electronic components are positioned within the first mold if the first functional test is successful, conducting a final device assembly after curing the second resin composition, conducting a second functional test of the device after the final device assembly, and preparing the device for shipment if the second functional test is successful.

Example 41 may include the method of Example 39, wherein injecting at least one of the first resin composition or the second resin composition causes the at least one of the first resin composition or the second resin composition to wick between at least one of the one or more electronic components and an adjacent circuit board of the device.

Example 42 may include the method of Example 41, wherein at least one of the first resin composition or the second resin composition are injected through an audio port of the device.

Example 43 may include the method of any one of Examples 23 to 34, wherein positioning at least one of the first cured resin composition or the second cured resin composition within the housing includes positioning at least one of the one or more electronic components within a mold, casting a resin composition into the mold, curing the resin composition to obtain a cured resin composition, and installing the at least one of the one or more electronic components into the housing.

Example 44 may include the method of Example 43, wherein casting the resin composition into the mold causes the resin composition to wick between the at least one of the one or more electronic components and an adjacent circuit board of the device.

Example 45 may include the method of Example 43, wherein the mold forms one or more openings in the resin composition for one or more additional electronic components to pass through.

Example 46 may include the method of Example 43, further including conducting a functional test of the device after installing the at least one of the one or more electronic components into the housing, conducting a final device assembly if the functional test of the device is successful, and preparing the device for shipment after conducting the final device assembly.

Example 47 may include the method of Example 43, further including using one or more attach points of the cured resin composition to couple the housing to the at least one of the one or more electronic components.

Example 48 may include a method of fabricating a device, comprising providing a housing, positioning one or more electronic components within the housing, wherein at least one of the one or more electronic components includes a power supply, and positioning a cured resin composition within the housing, the cured resin composition including a thermal energy storage material, wherein the cured resin composition encompasses at least the power supply.

Example 49 may include the method of Example 48, further including configuring a controller of the power supply to operate the power supply in a burst charge mode.

Example 50 may include the method of any one of Examples 48 or 49, wherein at least the power supply is a source of one or more of sparks or heat.

Example 51 may include the method of Example 50, wherein the cured resin composition enables the device to comply with an ATEX equipment directive for explosive atmospheres.

Example 52 may include the method of any one of Examples 48 or 49, wherein positioning the cured resin composition within the housing includes positioning the housing and the one or more electronic components within a mold, injecting a resin composition into the housing via the mold, and curing the resin composition to obtain the cured resin composition.

Example 53 may include the method of Example 52, further including conducting a first functional test of the device, wherein the housing and the one or more electronic components within the mold if the first functional test is successful, conducting a final device assembly after curing the resin composition, conducting a second functional test of the device after the final device assembly, and preparing the device for shipment if the second functional test is successful.

Example 54 may include the method of Example 52, wherein injecting at the resin composition causes the resin composition to wick between at least one of the one or more electronic components and an adjacent circuit board of the device.

Example 55 may include the method of Example 54, wherein the resin composition is injected through an audio port of the device.

Example 56 may include the method of any one of Examples 48 or 49, wherein positioning the cured resin composition within the housing includes positioning at least one of the one or more electronic components within a mold, casting the resin composition into the mold, curing the resin composition to obtain the cured resin composition, and installing the at least one of the one or more electronic components into the housing.

Example 57 may include the method of Example 56, wherein casting the resin composition into the mold causes the resin composition to wick between the at least one of the one or more electronic components and an adjacent circuit board of the device.

Example 58 may include the method of Example 56, wherein the mold forms one or more openings in the resin composition for one or more additional electronic components to pass through.

Example 59 may include the method of Example 56, further including conducting a functional test of the device after installing the at least one of the one or more electronic components into the housing, conducting a final device assembly if the functional test of the device is successful, and preparing the device for shipment after conducting the final device assembly.

Example 60 may include the method of Example 56, further including using one or more attach points of the cured resin composition to couple the housing to the at least one of the one or more electronic components.

Example 61 may include a method of fabricating a device, comprising providing a housing, positioning one or more electronic components within the housing, wherein at least one of the one or more electronic components is a source of one or more sparks or heat, and positioning a cured resin composition within the housing, the cured resin composition including a thermal energy storage material, wherein the cured resin composition encompasses the at least one of the one or more electronic components that is the source of one or more of sparks or heat.

Example 62 may include the method of Example 61, wherein the cured resin composition enables the device to comply with an ATEX equipment directive for explosive atmospheres.

Example 63 may include the method of any one of Examples 61 or 62, wherein positioning the cured resin composition within the housing includes positioning the housing and the one or more electronic components within a mold, injecting a resin composition into the housing via the mold, and curing the resin composition to obtain the cured resin composition.

Example 64 may include the method of Example 63, further including conducting a first functional test of the device, wherein the housing and the one or more electronic components within the mold if the first functional test is successful, conducting a final device assembly after curing the resin composition, conducting a second functional test of the device after the final device assembly, and preparing the device for shipment if the second functional test is successful.

Example 65 may include the method of Example 63, wherein injecting at the resin composition causes the resin composition to wick between at least one of the one or more electronic components and an adjacent circuit board of the device.

Example 66 may include the method of Example 65, wherein the resin composition is injected through an audio port of the device.

Example 67 may include the method of any one of Examples 61 or 62, wherein positioning the cured resin composition within the housing includes positioning at least one of the one or more electronic components within a mold, casting the resin composition into the mold, curing the resin composition to obtain the cured resin composition, and installing the at least one of the one or more electronic components into the housing.

Example 68 may include the method of Example 67, wherein casting the resin composition into the mold causes the resin composition to wick between the at least one of the one or more electronic components and an adjacent circuit board of the device.

Example 69 may include the method of Example 67, wherein the mold forms one or more openings in the resin composition for one or more additional electronic components to pass through.

Example 70 may include the method of Example 67, further including conducting a functional test of the device after installing the at least one of the one or more electronic components into the housing, conducting a final device assembly if the functional test of the device is successful, and preparing the device for shipment after conducting the final device assembly.

Example 71 may include the method of Example 67, further including using one or more attach points of the cured resin composition to couple the housing to the at least one of the one or more electronic components.

Example 72 may include an apparatus to fabricate a device, comprising means for performing the method of any one of Examples 23 to 71.

Thus, techniques described herein may achieve synergistic increases in structural rigidity, decreases in size, improvements in safety, enhancements in thermal performance and decreases in charging times form small form factor devices.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We Claim:

1. A device comprising:
a housing that defines at least part of an external shape of the device;
one or more electronic components positioned on a circuit board within the housing, wherein an electronic component of the one or more electronic components is to remain entirely within the housing during operation;
a first cured resin composition positioned over the electronic component and the circuit board within the housing, the first cured resin composition including a thermal energy storage material and a first filler material; and
a second cured resin composition positioned over the electronic component and the circuit board within the housing, the second cured resin composition including the thermal energy storage material and a second filler material,
wherein the first filler material and the second filler material are different, wherein the first cured resin composition and the second cured resin composition are in direct contact with one another; and
wherein each of the first cured resin composition and the second cured resin composition surround at least two sides of the electronic component and at least two sides of the circuit board to prevent direct contact of the electronic component and the circuit board with the housing;
wherein the first cured resin composition is located on a first side of the circuit board and on a second side of the circuit board orthogonal to the first side of the circuit board, and wherein the second resin composition is located only on a third side of the circuit board opposite to the first side of the circuit board and over the first cured resin composition and only the first side of the circuit board.

2. The device of claim 1, wherein the first cured resin composition and the second cured resin composition provide adhesion between two or more components of the device.

3. The device of claim 1, wherein the thermal energy storage material functions as a thermal capacitance material.

4. The device of claim 3, wherein the thermal capacitance material includes a wax.

5. The device of claim 1, wherein one of the first filler material and the second filler material includes a thermal conductivity material.

6. The device of claim 5, wherein the thermal conductivity material includes one or more of a metal, an oxide, a salt, or a nitride.

7. The device of claim 1, wherein one of the first filler material and the second filler material includes a strengthening material.

8. The device of claim 7, wherein the strengthening material includes one or more of glass rods, glass fiber, or carbon fibers.

9. The device of claim 1, wherein one of the first filler material and the second filler material includes a softening material.

10. The device of claim 9, wherein the softening material includes one or more of closed cell foam balls or styrene balls.

11. The device of claim 1, wherein one or more of the first cured resin composition and the second cured resin composition includes one or more of an epoxy, a silicone, or a urethane.

12. The device of claim 1, wherein the thermal energy storage material includes a phase change material.

13. The device of claim 1, wherein at least one of the one or more electronic components includes a power supply.

14. The device of claim 13, wherein the power supply includes a controller to operate the power supply in a burst charge mode.

15. The device of claim 1, wherein at least one of the one or more electronic components is a source of one or more of sparks or heat.

16. The device of claim 1, wherein the device complies with an ATEX equipment directive for explosive atmospheres.

* * * * *